(12) United States Patent
Armero

(10) Patent No.: US 12,432,885 B2
(45) Date of Patent: Sep. 30, 2025

(54) ENHANCED AVIONICS RACK MODULE

(71) Applicant: Airbus Operations SAS, Toulouse (FR)

(72) Inventor: Bernardo Armero, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 217 days.

(21) Appl. No.: 18/458,418

(22) Filed: Aug. 30, 2023

(65) Prior Publication Data

US 2024/0081028 A1 Mar. 7, 2024

(30) Foreign Application Priority Data

Sep. 1, 2022 (FR) ...................................... 2208799

(51) Int. Cl.
*H05K 7/20* (2006.01)
(52) U.S. Cl.
CPC ..... *H05K 7/20563* (2013.01); *H05K 7/20718* (2013.01)
(58) Field of Classification Search
CPC .......................... H05K 7/20554–20572; H05K 7/20718–20736; H05K 7/20754
See application file for complete search history.

(56) References Cited

U.S. PATENT DOCUMENTS

| 9,756,765 | B1* | 9/2017 | Michaud | H05K 7/1488 |
| 2007/0086158 | A1* | 4/2007 | Hartung | H05K 7/20563 |
| | | | | 361/690 |
| 2013/0294028 | A1* | 11/2013 | Lafont | H05K 7/20563 |
| | | | | 361/694 |
| 2022/0240407 | A1* | 7/2022 | Mourieras | H05K 7/1444 |

FOREIGN PATENT DOCUMENTS

| FR | 2872640 A1 | 1/2006 |
| WO | 2020035542 A1 | 2/2020 |

OTHER PUBLICATIONS

French Search Report for corresponding French Patent Application No. 2208799 dated Mar. 21, 2023.

\* cited by examiner

*Primary Examiner* — Jacob R Crum
(74) *Attorney, Agent, or Firm* — Greer, Burns & Crain Ltd.

(57) ABSTRACT

An avionics rack module, with two shelves and a column, the column linking the two shelves. The module has a first airstream and a second airstream each circulating in the column and in the shelves, to cool at least one avionics element. Each of the two shelves comprises (i) a plate extending on a transverse plane and intended to support an avionics element and comprises (ii) a half-shell extending on a longitudinal plane secant to the transverse plane and being intended to be joined to another half-shell of the other shelf of said module, to form the column. Also an avionics rack made from multiple modules and an aircraft with such an avionics rack.

11 Claims, 6 Drawing Sheets

ENHANCED AVIONICS RACK MODULE

CROSS-REFERENCES TO RELATED APPLICATIONS

This application claims the benefit of French Patent Application Number 2208799 filed on Sep. 1, 2022, the entire disclosure of which is incorporated herein by way of reference.

FIELD OF THE INVENTION

The invention relates to the field of avionics racks.

BACKGROUND OF THE INVENTION

It is known that modern aircraft have numerous avionics elements embedded.

It is specified here that the term avionics elements is understood to mean onboard electronic or computing elements.

As is known, in an aircraft, these elements can be placed under the cockpit, in a hold dedicated to this purpose and called avionics hold.

It is also known that the avionics elements (like most of the electronic and computing elements) dissipate heat in operation. It is therefore necessary to cool the avionics elements.

As is known, the avionics elements are fixed on to avionics racks which incorporate cooling streams.

Thus, it is known practice to have racks incorporating a pulsed cold airstream over the avionics elements and a reheated air suction stream. It is conventional practice to have such a refrigeration stream directly incorporated in the rack. The stream can for example circulate in shelves of the avionics rack and the air can be diffused therein or picked up by perforations or micro-perforations in the shelves.

These cooling systems incorporated in the avionics rack are effective. However, the avionics racks incorporating this type of cooling stream are complex to assemble and install in an avionics hold which is generally cramped.

In this context, it is necessary to provide a system that makes it possible to easily assemble an avionics rack while guaranteeing optimal cooling of the avionics elements disposed on the avionics rack.

SUMMARY OF THE INVENTION

To this end, according to a first aspect, an avionics rack module is proposed, the module comprising two shelves and a column, the column linking the two shelves, the module comprising a first airstream and a second airstream each circulating in the column and in the shelves, to cool at least one avionics element. Each of the two shelves comprises (i) a plate extending on a transverse plane and intended to support an avionics element and comprises (ii) a half-shell extending on a longitudinal plane secant to the transverse plane and being intended to be joined to another half-shell of the other shelf of said module, to form the column.

Thus, the joining of two shelves makes it possible to easily form a module. In addition, the column formed by the joining of two shelves has a dual function of mechanical support and of air circulation. The proposed module therefore makes it possible to easily assemble an avionics rack while guaranteeing optimum cooling of the avionics elements disposed on this avionics rack.

According to a particular provision, each half-shell has an upright panel joined to each plate, said upright panel being arranged in the longitudinal plane. According to a particular provision, each half-shell has a duct portion fixed to the upright panel and extending in a longitudinal direction.

According to a particular provision, when two half-shells are joined, the duct portions of each half-shell are juxtaposed and parallel.

According to a particular provision, each plate comprises a first internal channel emerging through a first aperture in the upright panel and comprises a second channel emerging through a second aperture in the upright panel.

According to a particular provision, the first aperture is positioned in the duct portion.

According to a particular provision, the second aperture is juxtaposed to the first aperture so as to be facing the duct portion of another half-shell when two half-shells are joined.

According to a particular provision, each duct portion has a third aperture arranged facing the second aperture of an upright panel when two half-shells are joined, to allow a fluidic circulation between the third aperture and the second aperture.

According to a particular provision, each half-shell comprises means for fixing to the other half-shell.

According to another aspect, an avionics rack is proposed comprising several modules as cited above.

According to another aspect, an aircraft is proposed comprising at least one avionics rack as previously described.

BRIEF DESCRIPTION OF THE DRAWINGS

The features of the invention mentioned above, and others, will become more clearly apparent on reading the following description of at least one exemplary embodiment, said description being given in relation to the attached drawings, in which.

DETAILED DESCRIPTION OF THE PREFERRED EMBODIMENTS

Avionics Rack Module

Figure 1:
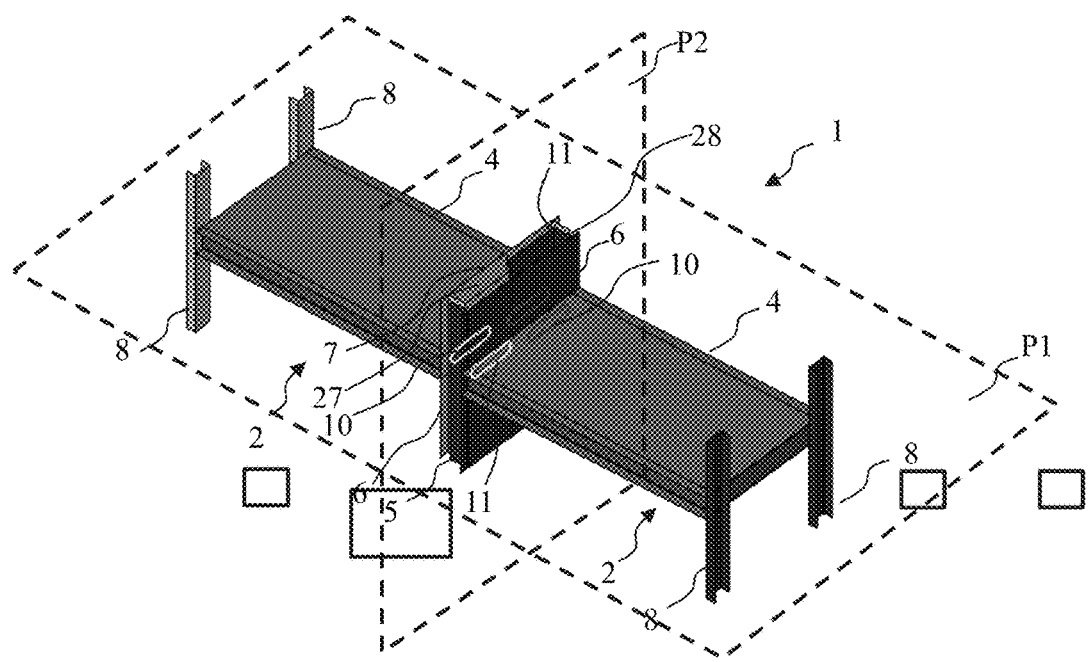
FIG. 1 is a perspective representation of an avionics rack module.

Referring to FIG. 1, a module 1 of an avionics rack 50 (not referenced in FIG. 1) is proposed; the module 1 comprises two shelves 2 and a column 5. The column 5 links the two shelves 2.

Figure 4:
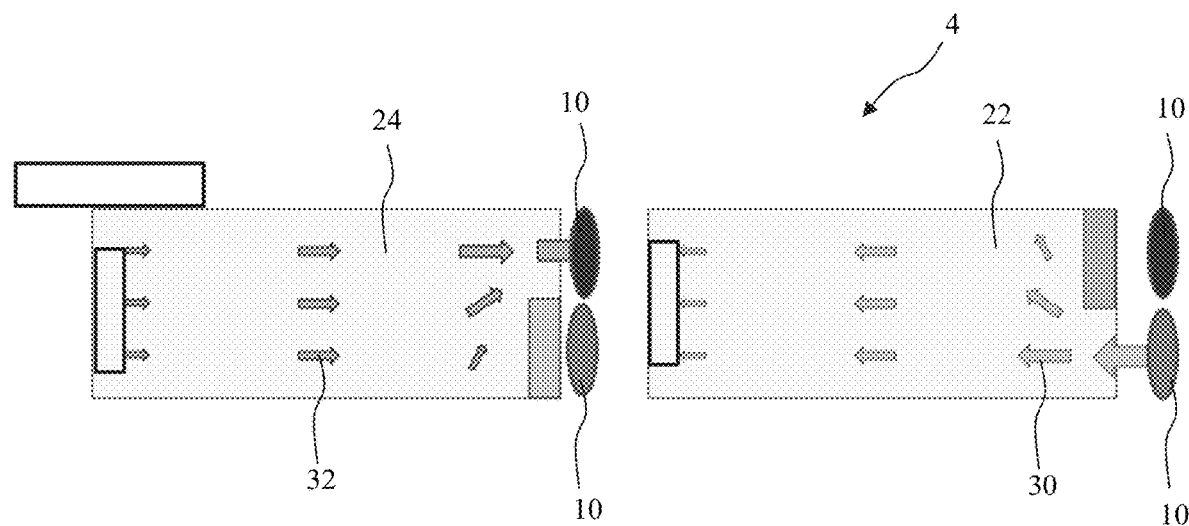
FIG. 4 is a schematic representation of an air circulation in the plate of one of the shelves of the avionics rack module.

The module 1 comprises a first airstream allowing the circulation of a first airstream 30 and a second airstream allowing the circulation of a second airstream 32 (represented in FIG. 4). The first airstream and the second airstream 32 each circulate in the column 5 and in the shelves 2, to cool at least one avionics element disposed on the avionics rack module. As will be described later, the first airstream 30 is a so-called cold airstream which is pulsed. In other words, the cold air is sent, pushed, pulsed, in the first airstream 30. The second airstream 32 is a so-called hot airstream which is sucked. More specifically, the hot air is the air which has been heated up on contact with the avionics elements and which is extracted from the avionics rack module.

According to a particular provision, the column 5 comprises two chimneys, a first chimney 27 suitable for allowing the circulation of the first airstream 30, and a second chimney 28 suitable for the circulation of the second airstream 32. It is specified that the first chimney 27 and the second chimney 28 are isolated from one another such that the first airstream 30 circulating in the first chimney 27 does not communicate (does not mix) with the second airstream 32 circulating in the second chimney 28.

Each of the two shelves 2 comprises (i) a plate 4 extending on a transverse plane P1 and intended to support an avionics element and comprises (ii) a half-shell 6 extending on a longitudinal plane P2 secant to the transverse plane and being intended to be joined to another half-shell 6 of the other shelf 2 of said module 1, to form the column 5 comprising the first chimney 27 and the second chimney 28.

Thus, in a particularly advantageous manner, the module 1 comprises two shelves 2 which are joined to one another. The joining of the two half-shells 6 of the two shelves 2 forms the central column 5 of the module 1 such that the two shelves 2 are sufficient to form a module 1 that is robust and that allows a circulation of air (as will be developed hereinbelow).

Shelf of the Module

Figure 2:
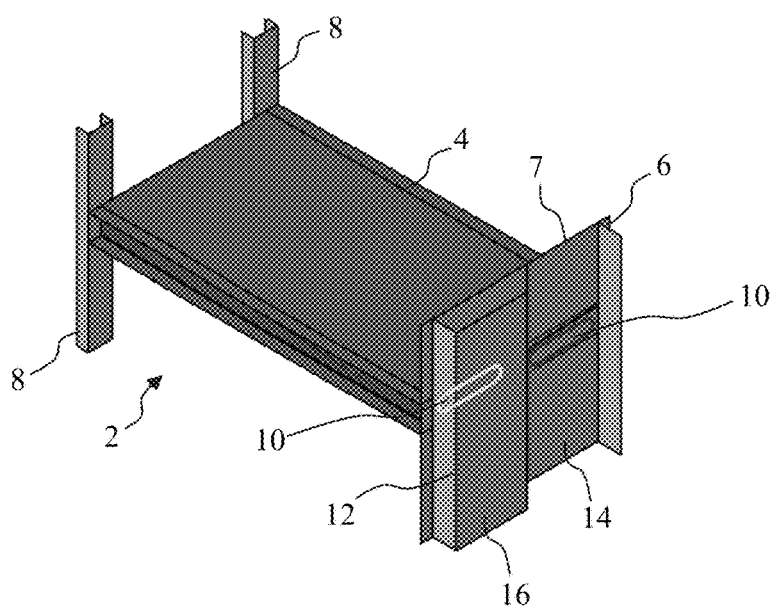
FIG. 2 is a perspective representation of one of the shelves of the avionics rack module already represented in FIG. 1.

Referring to FIG. 2, each shelf 2 comprises a plate 4 which extends on the transverse plane P1.

In a particularly advantageous manner, the plate 4 comprises two flat faces each having perforations or microperforations. The perforations are suitable for allowing a diffusion (or expulsion) of the first airstream 30 (cold air) and a suction of the second airstream 32 (hot air).

As schematically represented in FIG. 4, the plate 4 comprises two internal channels 22 and 24 which are positioned between the two faces of the plate. The first internal channel 22 is suitable for the circulation of the first airstream 30 and the second internal channel 24 is suitable for the circulation of the second airstream 32. As will be detailed hereinbelow, the first internal channel and the second internal channel each emerge outside the plate 4, in the half-shell 6, to be linked to the column 5. According to a particular provision, the first internal channel 22 and the second internal channel 24 are separated by an insulating wall (not represented). The insulating wall can be a hollow wall containing a volume of air; the insulating wall can also comprise glass fiber. According to a particular embodiment, the insulating wall has a thickness greater than or equal to 8 millimeters. According to a preferred provision, the insulating wall has a thickness greater than or equal to 10 millimeters.

As indicated previously, each shelf 2 comprises the plate 4 and the half-shell 6.

The half-shell 6 of each shelf 2 comprises an upright panel 7 which extends in the longitudinal plane P2.

According to a particular provision, the upright panel 7 is at right angles to the plate 4. In other words, according to this provision, the longitudinal plane P2 is at right angles to the transverse plane P1.

As will be described hereinbelow, the upright panel 7 provides a function of channeling of the airstreams (first airstream and second airstream) by forming a first chimney 27 and a second chimney 28, and provides a function of support of the plate 4 and of the avionics elements which may be positioned on the plate 4.

Furthermore, each half-shell 6 has a closed duct position 12 fixed to the upright panel 7 and extending in a longitudinal direction. Thus, as represented in FIG. 2, each half-shell 6 also comprises a closed duct portion 12 which is fixed to the upright panel 7. The closed duct portion 12 extends in a longitudinal direction at right angles to the transverse plane P1 in which the plate 4 extends. When two half-shells 6 are joined, the closed duct portions 12 form the first chimney 27 and the second chimney 28.

Figure 3:
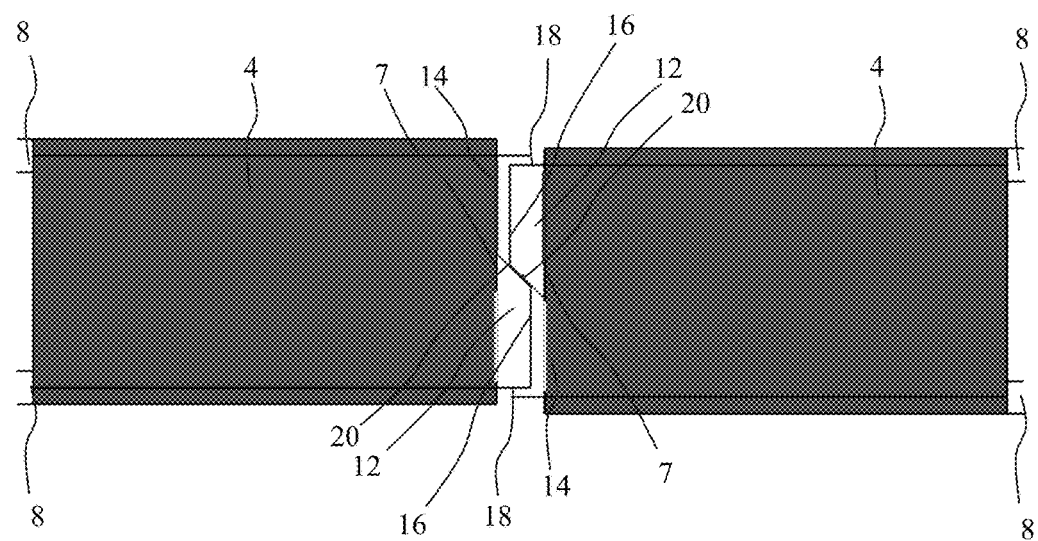
FIG. 3 is a top schematic representation of the avionics rack module represented in FIG. 1 and FIG. 2.

As schematically represented in FIG. 3, the closed duct portion 12 can have a trapezoid/rectangular section. A first wall 16 of the closed duct portion 12 is parallel to the upright panel 7. A second wall 18 of the closed duct portion 12 links the first wall 16 of the closed duct portion 12 to the upright panel 7. The second wall 18 of the closed duct portion 12 is at right angles to the upright panel 7 and to the first wall 16 of the closed duct portion 12.

A third wall 20 of the closed duct portion 12 links the first wall 16 of the closed duct portion 12 to the upright panel 7. The third wall 20 of the duct portion 12 is arranged slanted with respect to the upright panel 7, to the first wall 16 of the closed duct portion 12 and the second wall 18 of the closed duct portion 12. In other words, the third wall 20 of the closed duct portion 12 is inclined with respect to the upright panel 7 without being at right angles to the upright panel 7. It is specified that a fourth wall of the closed duct portion 12 is formed by the upright panel 7.

The inclination of the third wall 20 of the closed duct portion 12 is a particularly advantageous technical provision which facilitates the joining of two shelves 2.

Furthermore, the closed duct portion 12 is positioned on the upright panel 7 such that the upright panel 7 has an accommodating zone 14 for the closed duct portion 12 of another upright panel 7. Thus, when a first half-shell 6 is joined to a second half-shell 6, the first closed duct portion 12 of the first half-shell 6 and the second closed duct portion 12 of the second half-shell 6 are juxtaposed and parallel.

In addition, as indicated previously, the first channel and the second channel of each plate emerge in the upright panel 7 fixed to the plate 4. The first channel emerges in the upright panel through a first aperture 10. The second channel emerges in the upright panel through a second aperture 11. The first aperture is situated in the closed duct portion 12 and the second aperture 11 is situated in the accommodating zone 14.

Furthermore, the duct portion has a third aperture which faces the first aperture 10 in the closed duct portion 12. The third aperture is adapted to be facing the second aperture 11 of an upright panel 7 when the two half-shells 6 are joined, to allow a fluidic circulation between the third aperture and the second aperture 11. This provision will be detailed hereinbelow.

Furthermore, each half-shell 6 comprises means for joining to the other half-shell 6. According to one embodiment, the half-shells 6 are screwed.

Moreover, according to the embodiment presented here, each shelf 2 comprises two upright bars 8 fixed to the plate 4. The upright bars 8 extend in a longitudinal direction. The upright bars 8 make it possible to make the shelf 2 rigid and ensure a function of mechanical support when the module 1 is assembled.

Assembly Method

Figure 5:
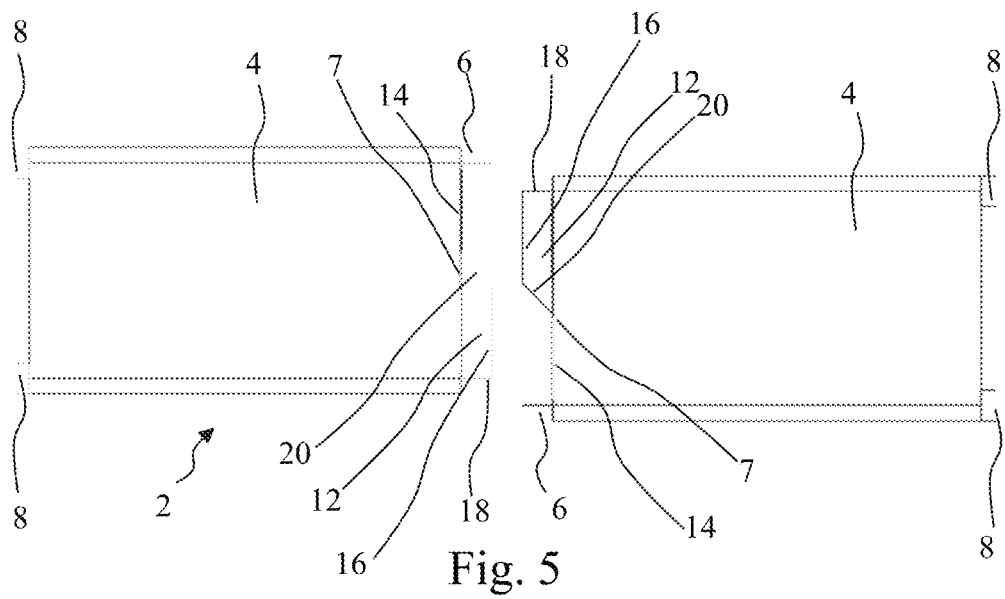
FIG. 5 schematically illustrates a first phase of fixing of the two shelves of the avionics rack module.
Figure 6:
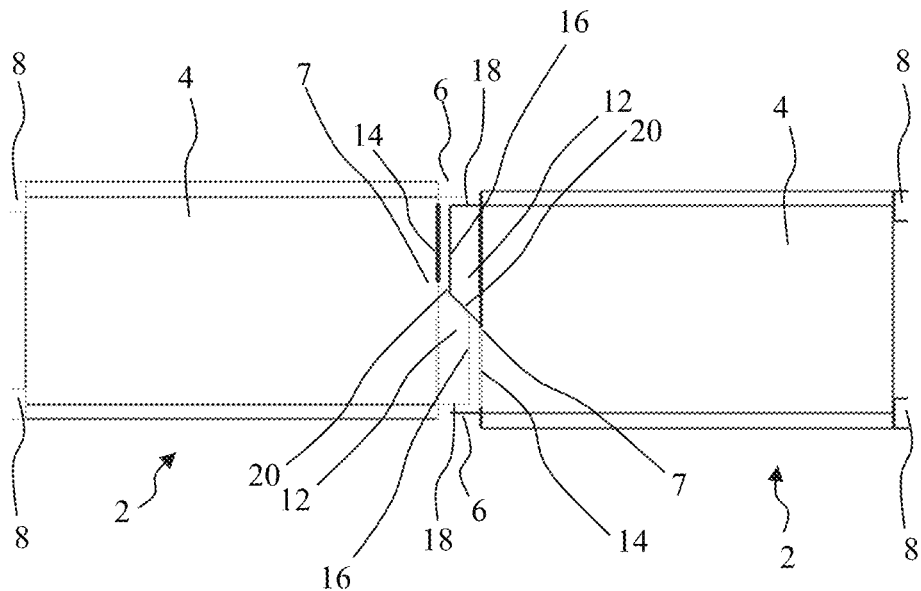
FIG. 6 schematically illustrates a second phase of fixing of the two shelves of the avionics rack module.
Figure 7:
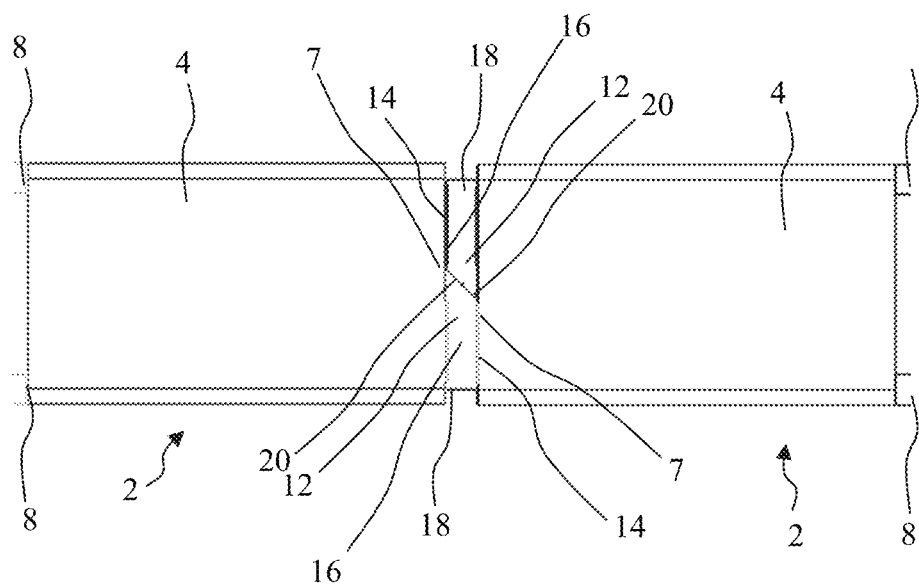
FIG. 7 schematically illustrates a third phase of fixing of the two shelves of the avionics rack module.
Figure 8:
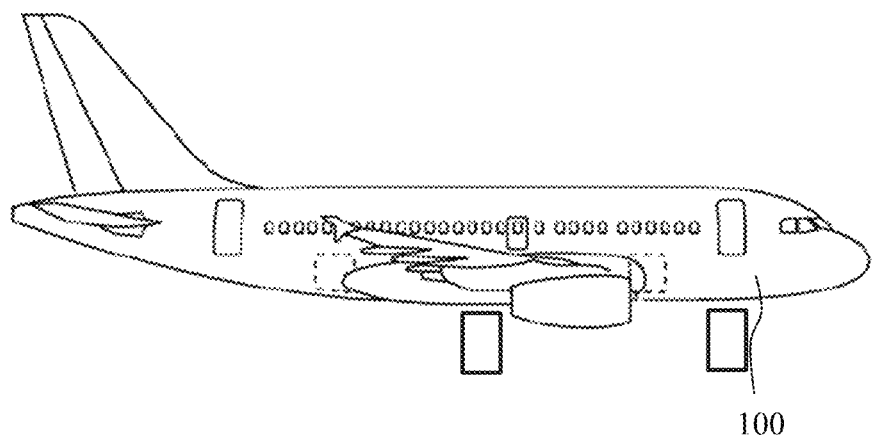
FIG. 8 schematically illustrates an aircraft incorporating the avionics rack.
Figure 9:
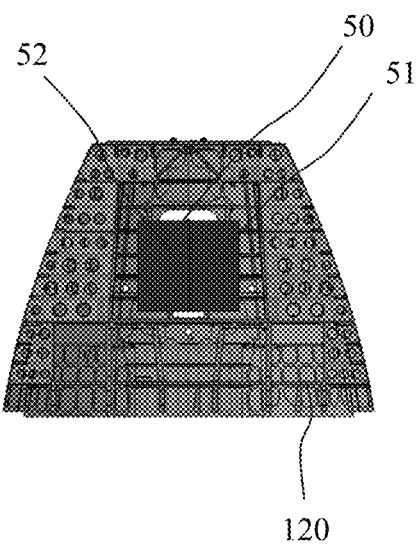
FIG. 9 schematically illustrates a first phase of fixing of the two shelves of the avionics rack module in the avionics hold of the aircraft.
Figure 10:
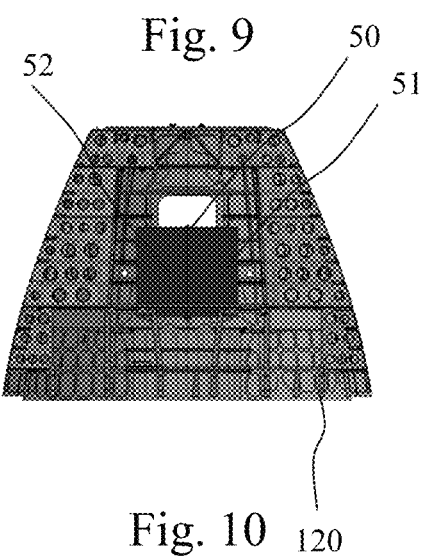
FIG. 10 schematically illustrates a second phase of fixing of the two shelves of the avionics rack module in the avionics hold of the aircraft.
Figure 11:
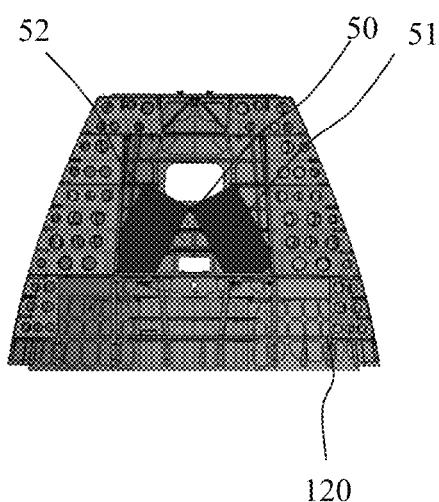
FIG. 11 schematically illustrates a third phase of fixing of the two shelves of the avionics rack module in the avionics hold of the aircraft.
Figure 12:
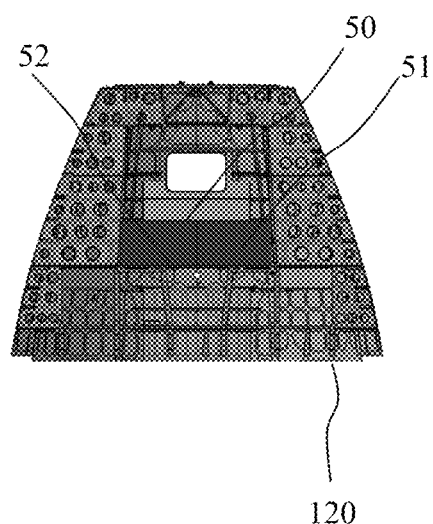
FIG. 12 schematically illustrates a fourth phase of fixing of the two shelves of the avionics rack module in the avionics hold of the aircraft.

Referring to FIGS. 5 to 7, the module 1 is assembled by coupling two half-shells 6 of two distinct shelves 2. As schematically represented in FIGS. 5 to 7, the third wall 20 of each closed duct portion 12 makes it possible to guide the assembly by having a guideway ramp function. In other words, during assembly, the third walls 20 of the two duct portions 12 slip against one another until the two duct portions 12 are each positioned in abutment against the accommodating zone 14 of the corresponding half-shell 6.

Cooling Operation

As indicated previously, the module 1 comprises two airstreams allowing the circulation of two airstreams 30 and 32. When the module is assembled, the cold air (first airstream 30) is injected through one of the duct portions 12 of the module 1. The cold air passes through the apertures in the closed duct portion 12 to spread out in the first channel of each plate 4. Then, the cold air is diffused through perforations of the faces of the plates 4.

In parallel, the hot air (second airstream 32) is sucked from the perforations of the faces of the plates 4. The hot air then circulates in the second duct of each plate 4 then emerges via the apertures in the second closed duct portion 12 of the module whence it is sucked then cooled by a cooling system before being reinjected into the first closed duct portion 12.

This system makes it possible to guarantee optimal cooling of avionics elements positioned on the module 1, while guaranteeing an extraction of hot air situated under the module 1.

Avionics Rack

According to another aspect, an avionics rack 50 is proposed comprising several modules 1 joined to one another.

In a particularly advantageous manner, the shelves 2 of the different modules 1 can be preassembled in two distinct series 51 and 52. In each series 51 and 52, the shelves 2 are assembled in the longitudinal direction. Then, the two series 51 and 52 are joined to one another by joining the half-shells 6 of each module 1.

Aircraft

According to another aspect, an aircraft 100 is proposed comprising the avionics rack 50.

Typically, the avionics rack 50 can be assembled and fixed in an avionics hold 120 of the aircraft 100.

Various avionics elements can be positioned on the avionics rack 50.

Method for Incorporation in the Avionics Hold

Referring to FIGS. 9 to 12, when being integrated in the avionics hold 120, the two series 51 and 52 of shelves 2 are introduced into the avionics hold 120, for example by means of a lift system. The shelves 2 of the two series 51 and 52 can be juxtaposed such that the half-shells 6 are all in one and the same plane. Then, the two series 51 and 52 are pivoted with respect to one another to join the corresponding half-shells 6 of each module 1.

Thus, this mode of assembly and of incorporation advantageously makes it possible to incorporate and easily assemble an avionics rack 50 in an avionics hold 120.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An avionics rack module comprising:
   two shelves and a column, the column linking the two shelves, and
   a first airstream and a second airstream each circulating in the column and in the two shelves to cool at least one avionics element,
   wherein each of the two shelves comprises (i) a plate extending on a transverse plane and configured to support an avionics element and (ii) a half-shell extending on a longitudinal plane secant to the transverse plane and configured to be joined to another half-shell of the other shelf of said module to form the column.

2. The avionics rack module according to claim 1, wherein each half-shell has an upright panel joined to each plate, said upright panel being in the longitudinal plane.

3. The avionics rack module according to claim 2, wherein each half-shell has a closed duct portion, fixed to the upright panel and extending in a longitudinal direction.

4. The avionics rack module according to claim 3, wherein when two half-shells are joined, the closed duct portions of each half-shell are juxtaposed and parallel.

5. The avionics rack module according to claim 1, wherein each plate comprises a first internal channel emerging through a first aperture in an upright panel and a second channel emerging by a second aperture in an upright panel.

6. The avionics rack module according to claim 5, wherein each half-shell has a closed duct portion, fixed to the upright panel and extending in a longitudinal direction, and
   wherein the first aperture is positioned in the closed duct portion.

7. The avionics rack module according to claim 6, wherein the second aperture is juxtaposed to the first aperture so as to be facing the closed duct portion of another half-shell when two half-shells are joined.

8. The avionics rack module according to claim 7, wherein each closed duct portion has a third aperture arranged facing the second aperture of an upright panel when two half-shells are joined, to allow a fluidic circulation between the third aperture and the second aperture.

9. The avionics rack module according to claim 1, wherein each half-shell comprises means for fixing to the other half-shell.

10. An avionics rack comprising:
a plurality of the avionics rack module according to claim 1.

11. An aircraft comprising:
at least one avionics rack according to claim 10.

* * * * *